(12) United States Patent
Huang et al.

(10) Patent No.: US 9,634,483 B2
(45) Date of Patent: Apr. 25, 2017

(54) ELECTROSTATIC DISCHARGE (ESD) PROTECTION CIRCUIT WITH EOS AND LATCH-UP IMMUNITY

(71) Applicant: PRINCETON TECHNOLOGY CORPORATION, New Taipei (TW)

(72) Inventors: Mine-Yuan Huang, New Tapei (TW); Li-Hung Chi, New Taipei (TW)

(73) Assignee: PRINCETON TECHNOLOGY CORPORATION, New Taipei (TW)

( * ) Notice: Subject to any disclaimer, the term of this patent is extended or adjusted under 35 U.S.C. 154(b) by 104 days.

(21) Appl. No.: 14/285,236

(22) Filed: May 22, 2014

(65) Prior Publication Data
US 2014/0355157 A1 Dec. 4, 2014

(30) Foreign Application Priority Data
May 28, 2013 (TW) .............................. 102118815 A

(51) Int. Cl.
*H02H 3/22* (2006.01)
*H02H 9/04* (2006.01)
*H01L 27/02* (2006.01)
*H01L 27/092* (2006.01)

(52) U.S. Cl.
CPC ............ *H02H 9/046* (2013.01); *H02H 9/041* (2013.01); *H01L 27/0248* (2013.01); *H01L 27/0921* (2013.01); *H02H 9/043* (2013.01)

(58) Field of Classification Search
USPC .......................................... 361/56, 91.1, 111
See application file for complete search history.

(56) References Cited

U.S. PATENT DOCUMENTS

| | | | |
|---|---|---|---|
| 6,492,859 B2 | 12/2002 | Vashchenko et al. | |
| 6,989,979 B1 | 1/2006 | Tong et al. | |
| 2004/0080880 A1* | 4/2004 | Yang | H02H 9/041 361/56 |
| 2004/0150929 A1* | 8/2004 | Strayer | B62D 5/0457 361/91.1 |
| 2005/0111150 A1 | 5/2005 | Jang et al. | |
| 2007/0188953 A1* | 8/2007 | Lee | H01L 27/0285 361/56 |
| 2008/0007882 A1* | 1/2008 | Bernard | H02H 9/046 361/56 |
| 2009/0284882 A1* | 11/2009 | Nakamura | H03K 17/00 361/56 |
| 2010/0149701 A1* | 6/2010 | Drapkin | H02H 9/046 361/56 |
| 2010/0328827 A1 | 12/2010 | Lai et al. | |

(Continued)

*Primary Examiner* — Danny Nguyen
(74) *Attorney, Agent, or Firm* — Muncy, Geissler, Olds & Lowe, P.C.

(57) ABSTRACT

An electrostatic discharge (ESD) protection circuit with electrical overstress (EOS) and latch-up immunity has a main ESD circuit, a voltage detection circuit and an electrostatic driving circuit. The main ESD circuit is coupled between a first rail and a second rail and has a control end. The main ESD circuit is configured to establish an electrical connection between the first rail and the second rail based on a voltage of the control end. The voltage detection circuit is coupled between the first rail and the second rail for setting the voltage of the control end when a voltage of the first rail is greater than a limiting voltage. The electrostatic driving circuit is used to drive the main ESD circuit when an ESD phenomenon occurs.

13 Claims, 10 Drawing Sheets

(56) References Cited

U.S. PATENT DOCUMENTS

| | | | |
|---|---|---|---|
| 2011/0194219 A1* | 8/2011 | Tailliet | H01L 27/0285 361/56 |
| 2011/0304940 A1* | 12/2011 | Cao | H01L 23/60 361/56 |
| 2012/0320476 A1* | 12/2012 | Disney | H03K 17/0822 361/56 |
| 2014/0133055 A1* | 5/2014 | Parthasarathy | H02H 9/041 361/56 |
| 2014/0198415 A1* | 7/2014 | Schulmeyer | H02H 9/046 361/56 |
| 2015/0214732 A1* | 7/2015 | Haruki | H02H 9/042 361/56 |

* cited by examiner

ELECTROSTATIC DISCHARGE (ESD) PROTECTION CIRCUIT WITH EOS AND LATCH-UP IMMUNITY

CROSS REFERENCE TO RELATED APPLICATIONS

This Application claims priority of Taiwan Patent Application No. 102118815, filed on May 28, 2013, the entirety of which is incorporated by reference herein.

BACKGROUND OF THE INVENTION

Field of the Invention

The present invention relates to an electrostatic discharge protection circuit, and in particular it relates to an electrostatic discharge protection circuit with a voltage detection circuit and an electrostatic driving circuit.

Description of the Related Art

Electrostatic discharge (ESD) and electrical overstress (EOS) are two major contributors to the damage of electrical component and electrical system, which would cause temporary or permanent damage to electrical systems and their components. These unexpected electrical stresses will cause damage to electrical components, cause the integrated circuits (IC) to work abnormally, and cause the electronic product to malfunction gradually.

Damage inflicted by electrostatic discharge to a product may be caused by a wide range of factors, which are often not easily avoidable. Static electricity can be accumulated during the manufacturing, assembling, testing, and storage processes; it is also accumulated in the human body, instrumentation, and storage equipment, especially in the electronic components themselves. Being unaware of the static electricity, humans become a transfer gateway for static electricity to discharge when they come in contact with electronic elements, thereby causing damage to the electronic systems and components.

FIG. 1 is a schematic diagram illustrating an electrostatic discharge protection circuit of the prior art. As shown in FIG. 1, the electrostatic discharge protection circuit 100 is arranged to protect other circuits from ESD damage. The electrostatic discharge protection circuit 100 includes a time-constant circuit 110, an inverter 120 and an NMOS transistor N2. The time-constant circuit 110 is constituted by the resistor RA and the capacitor CA, and arranged to provide a time constant. Moreover, the drain D, the source S and the gate G of the NMOS transistor N2 are coupled to the pin 130, the ground and the output terminal of the inverter 120, respectively. When an ESD event occurs at the pin 130, the time-constant circuit 110 induces a low voltage to be applied to the input terminal of the inverter 120, such that a high voltage is applied to the gate G of the NMOS transistor N2 to turn on the NMOS transistor N2, and a discharge path is formed between the pin 130 and the ground. At the same time, the ESD current can be discharged by the NMOS transistor N2 which is turned on.

However, when the circuits protected by the electrostatic discharge protection circuit 100 are operating or are undergoing a latch-up test, EOS event might take place and cause the latch-up phenomenon in the circuits protected by the electrostatic discharge protection circuit 100. Therefore, the prior electrostatic discharge protection circuit 100 is not capable of providing EOS and latch-up immunity.

BRIEF SUMMARY OF THE INVENTION

A detailed description is given in the following embodiments with reference to the accompanying drawings.

The present invention provides an electrostatic discharge protection circuit capable of providing ESD protection, EOS protection and latch-up immunity.

One of the embodiments discloses an electrostatic discharge protection circuit. The electrostatic discharge protection circuit includes a main ESD circuit, a voltage detection circuit and electrostatic driving circuit. The main ESD circuit is coupled between a first rail and a second rail, and the main ESD circuit further includes a control end. The main ESD circuit is arranged to establish an electrical connection between the first rail and the second rail based on the voltage at the control end. The voltage detection circuit is coupled between the first rail and the second rail for setting the voltage at the control end and driving the main ESD circuit to establish the electrical connection between the first rail and the second rail when the voltage at the first rail is greater than a limiting voltage. The electrostatic driving circuit is arranged to be coupled to the control end of the main ESD circuit to drive the main ESD circuit to establish the electrical connection between the first rail and the second rail when an ESD event occurs.

The electrostatic discharge protection circuit embodying the spirit of the invention is arranged to provide ESD protection by a discharge path constituted by the main ESD circuit to avoid ESD damage to the internal circuit when an ESD event occurs. Moreover, when the voltage at the first rail is greater than the limiting voltage, the electrostatic discharge protection circuit drives the main ESD circuit to constitute a discharge path through the voltage detection circuit, such that the voltage at the first rail can be reduced in a short time. When the voltage at the first rail is higher than the limiting voltage but the electrostatic driving circuit is not able to work within a period of the time constant due to the voltage boost rate of the voltage at the first rail being slower than the ESD discharge rate, the excessively high voltage at the first rail enables the voltage detection circuit to successfully drive the main ESD circuit to constitute a discharge path for avoiding the latch-up phenomenon caused by the breakdown of the internal circuit.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
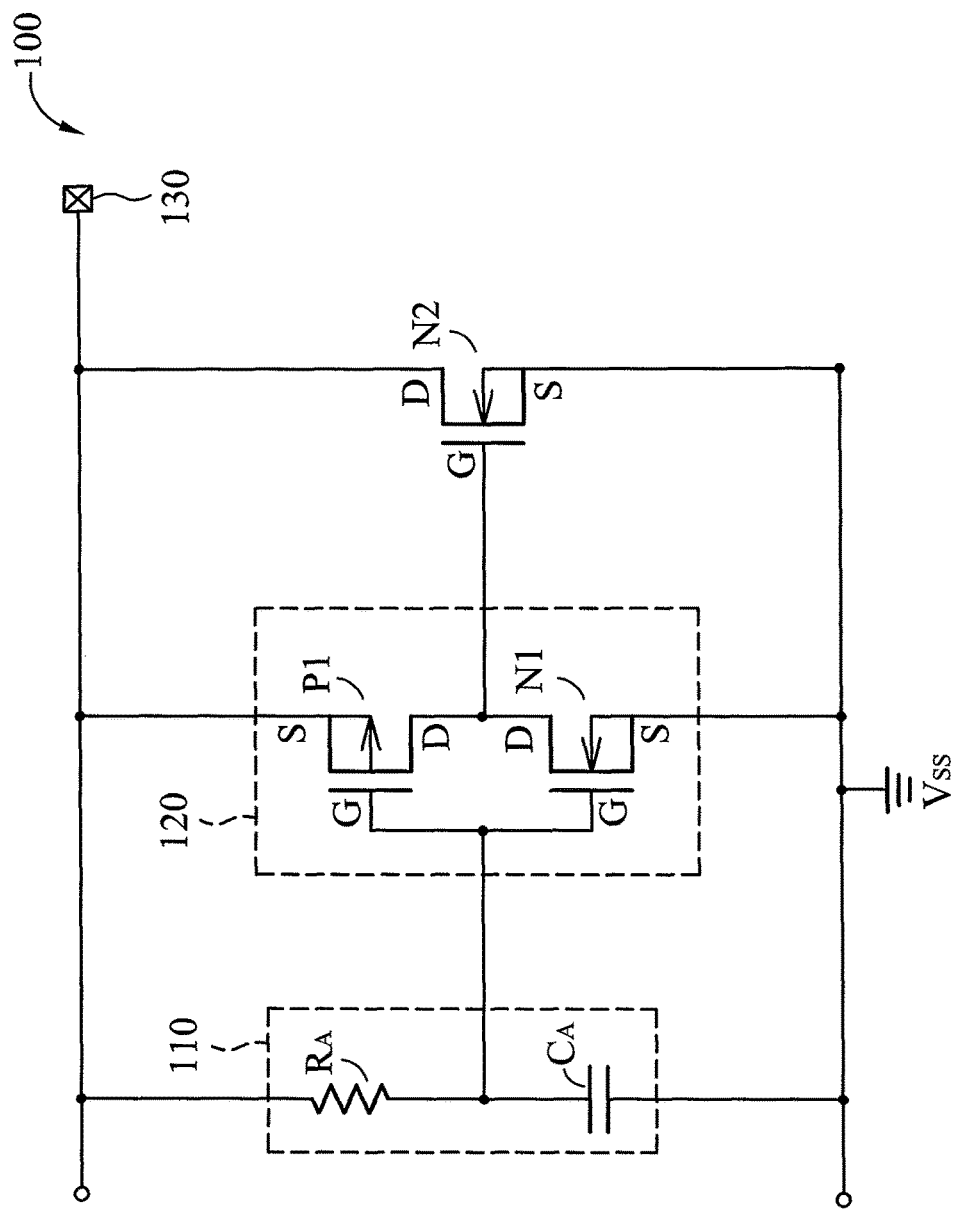
FIG. 1 is a schematic diagram illustrating an electrostatic discharge protection circuit of the prior art.
Figure 2:
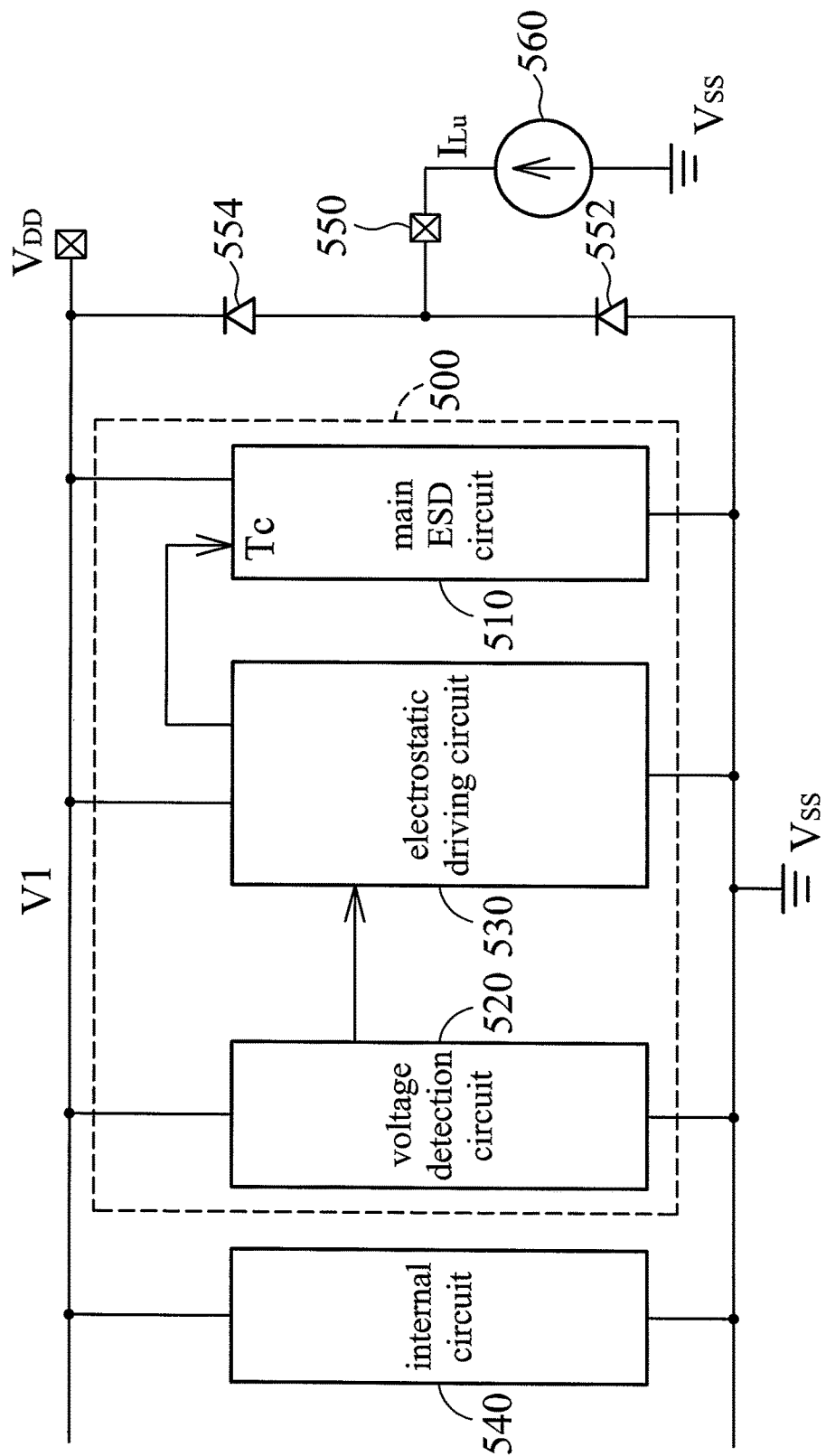
FIG. 2 is a schematic diagram illustrating an electrostatic discharge protection circuit of the present invention.

FIG. 2 is a schematic diagram illustrating an electrostatic discharge protection circuit of the present invention. As FIG. 2 shows, the electrostatic discharge protection circuit 500 is coupled between the first rail VDD and the second rail VSS. The electrostatic discharge protection circuit 500 is configured to protect the internal circuit 540 from ESD damage, and avoid an EOS event and the latch-up phenomenon occurring in the internal circuit 540 during the latch-up test or operations. The first rail VDD is a first power supply terminal of the system, and the second rail VSS is the second power supply terminal of the system, wherein the second rail VSS might be coupled to the ground. The electrostatic discharge protection circuit 500 includes a main ESD circuit 510, a voltage detection circuit 520 and an electrostatic driving circuit 530. The main ESD circuit 510 is coupled between the first rail VDD and the second rail VSS, wherein the main ESD circuit 510 further includes a control end Tc arranged to establish the electrical connection between the first rail VDD and the second rail VSS based on the voltage at the control end Tc. The voltage detection circuit 520 is coupled between the first rail VDD and the second rail VSS, and also coupled to the electrostatic driving circuit 530. The voltage detection circuit 520 is configured to set the voltage at the control end Tc when the voltage V1 at the first rail VDD is greater than a limiting voltage for driving the main ESD circuit 510 to establish the electrical connection between the first rail VDD and the second rail VSS, wherein the purpose of setting the limiting voltage is to avoid the latch-up phenomenon in the internal circuit 540 due to the excessive voltage V1. When the voltage V1 at the first rail VDD is too high to exceed the limiting voltage, the voltage detection circuit 520 sets the voltage at the control end Tc, such that the main ESD circuit 510 establishes the electrical connection between the first rail VDD and the second rail VSS to reduce the voltage V1 and prevent latch-up from occurring in the internal circuit 540.

The electrostatic driving circuit 530 is coupled to the control end Tc of the main ESD circuit 510, and arranged to set the voltage at the control end Tc when the instant variation of the voltage V1 at the first rail is greater than a predetermined value to drive the main ESD circuit 510 to establish the electrical connection between the first rail VDD and the second rail VSS, wherein the instant variation of the voltage V1 is caused by ESD effect. More specifically, when the ESD current flows in from the I/O pad 550, the voltage V1 at the first rail VDD changes. To protect the internal circuit 540 from ESD damage, when the instant variation of the voltage V1 is greater than the predetermined value, the electrostatic driving circuit 530 sets the voltage at the control end Tc for driving the main ESD circuit 510 to establish an electrical connection between the first rail VDD and the second rail VSS, such that the ESD current is discharged through the main ESD circuit 510.

In one embodiment, the electrostatic driving circuit 530 provides a time constant. During the period of the time constant, when the instant variation of the voltage V1 at the first rail VDD is greater than the predetermined value, the electrostatic driving circuit 530 enables the main ESD circuit 510 to drive the main ESD circuit 510 to establish the electrical connection between the first rail VDD and the second rail VSS. Moreover, during the period of the time constant and when the voltage V1 at the first rail VDD is greater than the limiting voltage, the instant variation of the voltage V1 might not be greater than the predetermined value because the ESD effect does not occur. Although the electrostatic driving circuit 530 is not actuated during the period of the time constant when the voltage V1 at the first rail VDD is greater than the limiting voltage and the instant variation of the voltage V1 is not greater than the predetermined value, the voltage detection circuit 520 is actuated in response to the excessively high voltage V1 and drives the main ESD circuit 510 to establish the electrical connection between the first rail VDD and the second rail VSS. Therefore, when the voltage V1 at the first rail VDD is greater than the limiting voltage and the electrostatic driving circuit 530 is not actuated due to the voltage boost rate being slower than the ESD discharge rate during the period of the time constant, the excessively high voltage V1 at the first rail VDD can still enable the voltage detection circuit 520 to drive the main ESD circuit 510 to constitute the discharge path for preventing latch-up from occurring in the internal circuit 540. The electrostatic driving circuit 530 can include an RC circuit for setting the time constant, and the time constant can be adjusted by the resistance and the capacitance of the RC circuit of the electrostatic driving circuit 530. Moreover, the predetermined value can be set to a value being a multiple of the rated voltage of the internal circuit 540 for preventing the faulty operations of the electrostatic driving circuit 530 during the normal operation of the internal circuit 540. Moreover, in one of the embodiments, the time constant of the electrostatic driving circuit 530 can be shorter than the response time of the voltage detection circuit 520. When the ESD effect occurs in an extremely short time, the electrostatic driving circuit 530 can be actuated due to the ESD effect before the voltage detection circuit 520 is actuated.

In one of the embodiments, the electrostatic discharge protection circuit 500 further includes a first diode 552 and a second diode 554 coupled in series with each other between the first rail VDD and the second rail VSS, and the I/O pad 550 can be coupled to the electrostatic discharge protection circuit 500 through the first diode 552 and the second diode 554, wherein the anode of the first diode 552 is coupled to the second rail VSS, the cathode of the second diode 554 is coupled to the first rail VDD, and the cathode of the first diode 552 and the anode of the second diode 554 are coupled to the I/O pad 550. Moreover, the I/O pad 550 can be coupled to the current source 560, wherein the current source 560 may be the current source of the latch-up and EOS test for providing the test current ILu. It should be noted that the first diode 552, the second diode 554, the I/O pad 550 and the current source 560 are used to illustrate the applicable configuration of the electrostatic discharge protection circuit 500 of the present invention, but it is not limited thereto.

Figure 3:
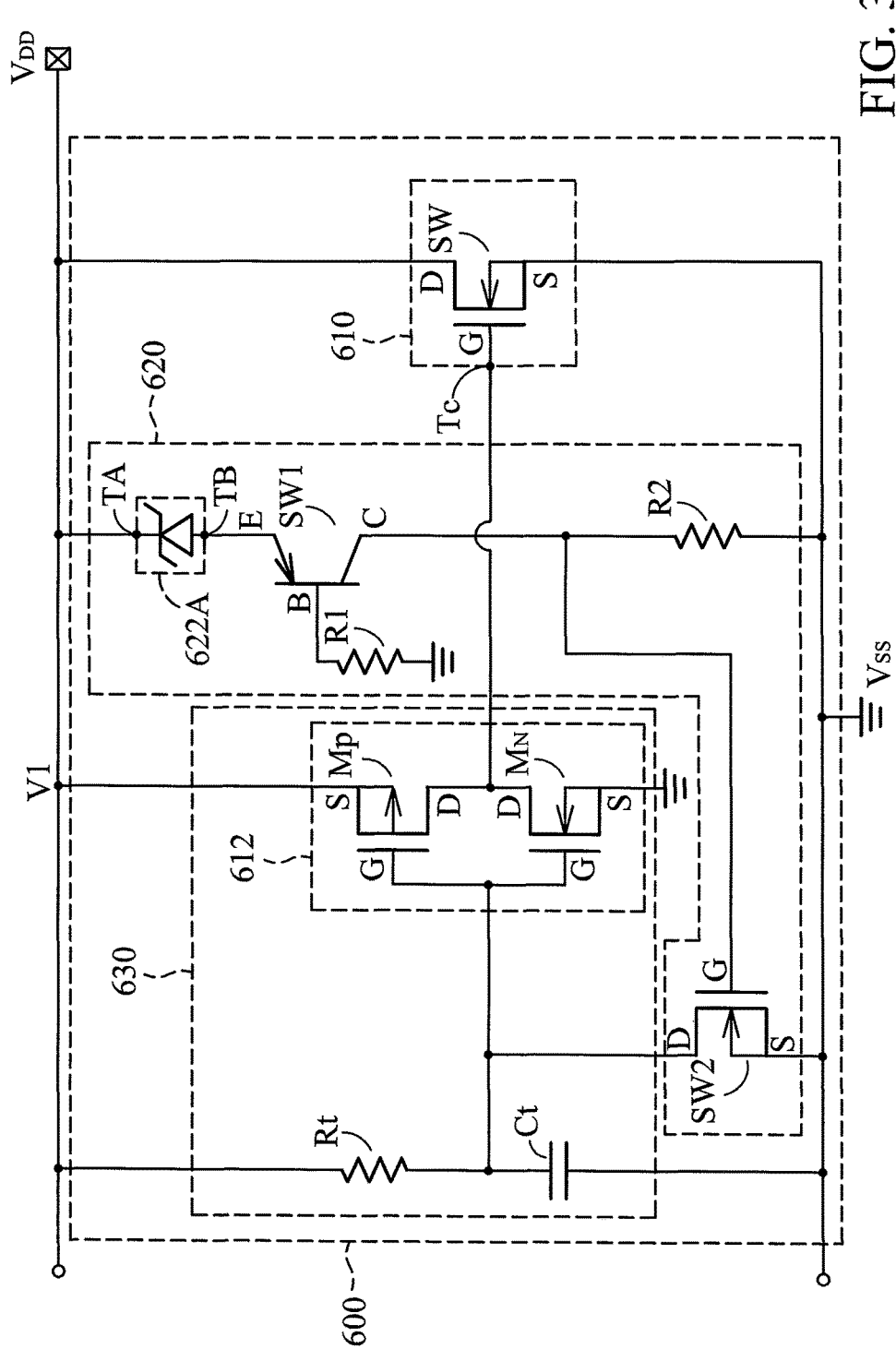
FIG. 3 is a schematic diagram illustrating a first embodiment of the electrostatic discharge protection circuit of FIG. 2 of the present invention.

FIG. 3 is a schematic diagram illustrating a first embodiment of the electrostatic discharge protection circuit of FIG. 2 of the present invention. As FIG. 3 shows, the electrostatic discharge protection circuit 600 includes a main ESD circuit 610, a voltage detection circuit 620 and an electrostatic driving circuit 630. The main ESD circuit 610 is configured to establish the electrical connection between the first rail VDD and the second rail VSS based on the voltage at the control end Tc. The voltage detection circuit 620 is arranged to set the voltage at the control end Tc when the voltage V1 at the first rail VDD is greater than the limiting voltage for driving the main ESD circuit 610 to establish the electrical connection between the first rail VDD and second rail VSS. The electrostatic driving circuit 630 is configured to set the voltage at the control end Tc to drive the main ESD circuit 610 to establish the electrical connection between the first rail VDD and the second rail VSS when the instant variation of the voltage V1 at the first rail is greater than the predetermined value.

The main ESD circuit 610 includes a switch SW, and the electrostatic driving circuit 630 includes a resistor Rt, a capacitor Ct and an inverter 612. The first terminal D of the switch SW is coupled to the first rail VDD, the second terminal S of the switch SW is coupled to the second rail VSS, and the control terminal G of the switch SW is coupled to the control end Tc. Therefore, in this embodiment, the voltage level of the control terminal G of the switch SW is equal to the voltage level of the control end Tc. When the voltage at the control end Tc and the voltage at the control terminal G of the switch SW are at a high level, the switch SW is turned on to establish the electrical connection between the first rail VDD and the second rail VSS; when the voltage at the control end Tc and the voltage at the control terminal G of the switch SW are at a low level, the switch SW is turned off. The first terminal of the resistor Rt is coupled to the first rail VDD, the second terminal of the resistor Rt and the first terminal of the capacitor Ct is coupled to the input terminal of the inverter 612, and the second terminal of the capacitor Ct is coupled to the second rail VSS. The resistor Rt and the capacitor Ct are arranged to provide a time constant. When the variation of the voltage V1 at the first rail VDD during the period of the time constant is greater than the predetermined value due to the ESD effect, the voltage at the input terminal of the inverter 612 is at a low level, such that the voltage at the control end Tc is at a high level. At the same time, the switch SW of the main ESD circuit 610 is turned on to establish the electrical connection between the first rail VDD and the second rail VSS. Therefore, the ESD current can be discharged through the discharge path established by the main ESD circuit 610 immediately when the ESD event occurs.

The voltage detection circuit 620 includes a limiting voltage setup circuit 622A, a first switch SW1, a first resistor R1, a second resistor R2 and a second switch SW2. The limiting voltage setup circuit 622A includes a first terminal TA and a second terminal TB. The first terminal TA is coupled to the first rail VDD, and the second terminal TB is coupled to the first terminal E of the first switch SW1. The second terminal C of the first switch SW1 is coupled to the first terminal of the second resistor R2, and the control terminal B of the first switch SW1 is coupled to the first terminal of the first resistor R1. The second terminal of the first resistor R1 and the second terminal of the second resistor R2 are coupled to the second rail VSS. The first terminal D of the second switch SW2 is coupled to the input terminal of the inverter 612, the second terminal S of the second switch SW2 is coupled to the second rail VSS, and the control terminal G of the second switch SW2 is coupled to the second terminal C of the first switch SW1 and the first terminal of the second resistor R2. The limiting voltage setup circuit 622A is configured to establish the electrical connection between the first terminal TA and the second terminal TB when the voltage V1 at the first rail VDD is greater than the limiting voltage. In this embodiment, the limiting voltage setup circuit 622A is a zener diode, wherein the first terminal TA is the cathode of the zener diode, the second terminal TB is the anode of the zener diode, and the limiting voltage is the sum of the breakdown voltage of the zener diode and the turn-on voltage of the emitter-base interface of the first switch SW1. Therefore, the limiting voltage setup circuit 622A is turned on when the voltage V1 of the first rail VDD is greater than the limiting voltage, and the first switch SW1 is turned on, such that a high-level voltage is applied to the control terminal G of the second switch SW2 and the second switch SW2 is turned on. When the second switch SW2 is turned on, a low-level voltage is applied to the input terminal of the inverter 612, such that the switch SW is turned on due to the high-level voltage at the control end Tc. Therefore, the switch SW of the main ESD circuit 610 is turned on to establish the electrical connection between the first rail VDD and the second rail VSS when the voltage V1 at the first rail VDD is greater than the limiting voltage.

Moreover, when the voltage V1 of the first rail VDD is greater than the limiting voltage, the variation of the voltage V1 at the first rail VDD might be less than the predetermined value during the period of the time constant provided by the resistor Rt and the capacitor Ct. Under this condition, although the electrostatic driving circuit 630 does not actuate in response to ESD effect, the voltage detection circuit 620 is actuated to enable the electrostatic driving circuit 630 to set the voltage at the control end Tc for driving the main ESD circuit 610 to establish the electrical connection between the first rail VDD and the second rail VSS. Therefore, when the voltage V1 at the first rail VDD is greater than the limiting voltage and the electrostatic driving circuit 630 does not actuate due to the boost rate of the voltage V1 being slower than the ESD discharge rate during the period of the time constant, the voltage detection circuit 620 can still drive the main ESD circuit 610 to form the discharge path during the period of the time constant to prevent latch-up in the internal circuit.

In this embodiment, the switch SW is an NMOS transistor, and the inverter 612 includes a PMOS transistor MP and an NMOS transistor MN. The first terminal D of the switch SW is the drain of the NMOS transistor, the second terminal S of the switch SW is the source of the NMOS transistor, and the control terminal G of the switch SW is the gate of the NMOS transistor. The drain D of the PMOS transistor MP is coupled to the drain D of the NMOS transistor MN, the gate G of the PMOS transistor MP and the gate G of the NMOS transistor MN are coupled to the resistor Rt and the capacitor Ct, the source S of the PMOS transistor MP is coupled to the first rail VDD, and the source S of the NMOS transistor MN is coupled to the second rail VSS. It should be noted that, other than the NMOS transistor, the switch SW also can be implemented by an NPN bipolar junction transistor. Moreover, in this embodiment, the first switch SW1 is a PNP bipolar junction transistor, and the first terminal E, the second terminal C and the control terminal B of the first switch SW1 are the emitter, the collector, and the base of the PNP bipolar junction transistor, respectively. The second switch SW2 is the NMOS transistor, and the first terminal D, the second terminal S and the control terminal G of the second switch SW2 are the drain, the source and the gate of the NMOS transistor, respectively. It should be noted that the first switch SW1 can also be implemented by the PMOS transistor and the second switch SW2 can also be implemented by the NPN bipolar junction transistor.

Figure 5:
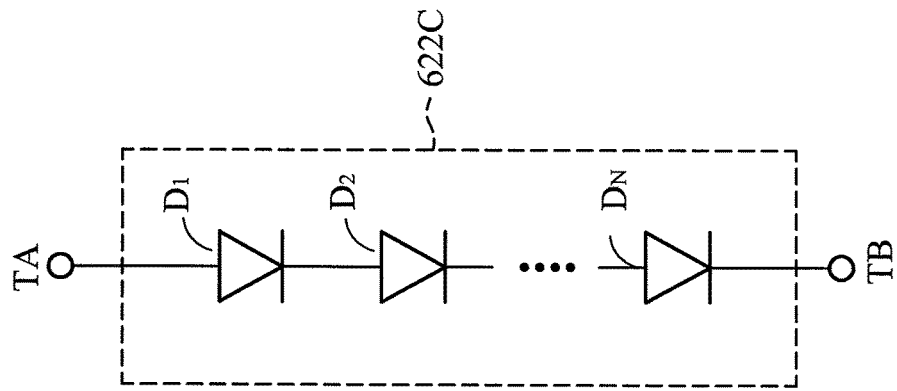
FIG. 5 is a schematic diagram illustrating another embodiment of a limiting voltage setup circuit of the present invention.
Figure 4:
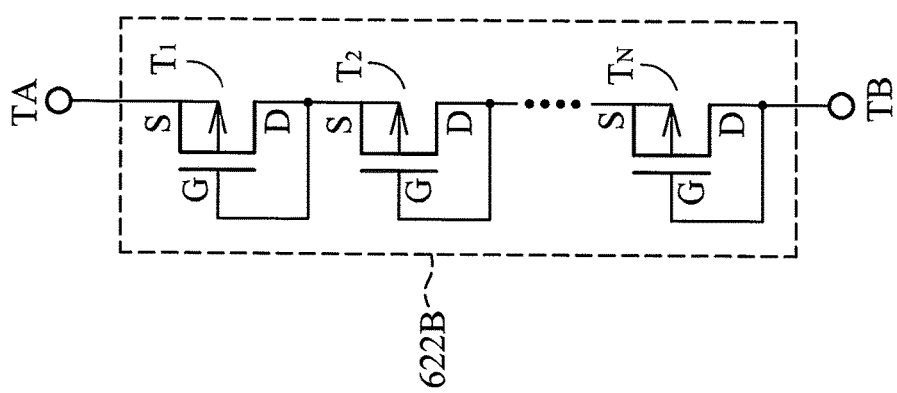
FIG. 4 is a schematic diagram illustrating an embodiment of a limiting voltage setup circuit of the present invention.

In other embodiments, the limiting voltage setup circuit 622A can be replaced by other circuits. For example, the limiting voltage setup circuit 622A can be replaced by the transistors T1~TN, which are coupled in series with each other and labeled as the limiting voltage setup circuit 622B in FIG. 4, or otherwise the limiting voltage setup circuit 622A can also be replaced by the diodes D1~DN, which are coupled in series with each other and labeled as the limiting voltage setup circuit 622C in FIG. 5. As to the limiting voltage setup circuit 622B, when the voltage difference between the first terminal TA and the second terminal TB of the limiting voltage setup circuit 622B is greater than or equal to the sum of the threshold voltages of the transistors T1~TN, the first terminal TA of the limiting voltage setup circuit 622B is electronically coupled to the second terminal TB of the limiting voltage setup circuit 622B. As to the limiting voltage setup circuit 622C, when the voltage difference between the first terminal TA and the second terminal TB of the limiting voltage setup circuit 622B is greater than or equal to the sum of the forward voltages of the diodes D1~DN, the first terminal TA of the limiting voltage setup circuit 622C is electronically coupled to the second terminal TB of the limiting voltage setup circuit 622C.

Figure 6:
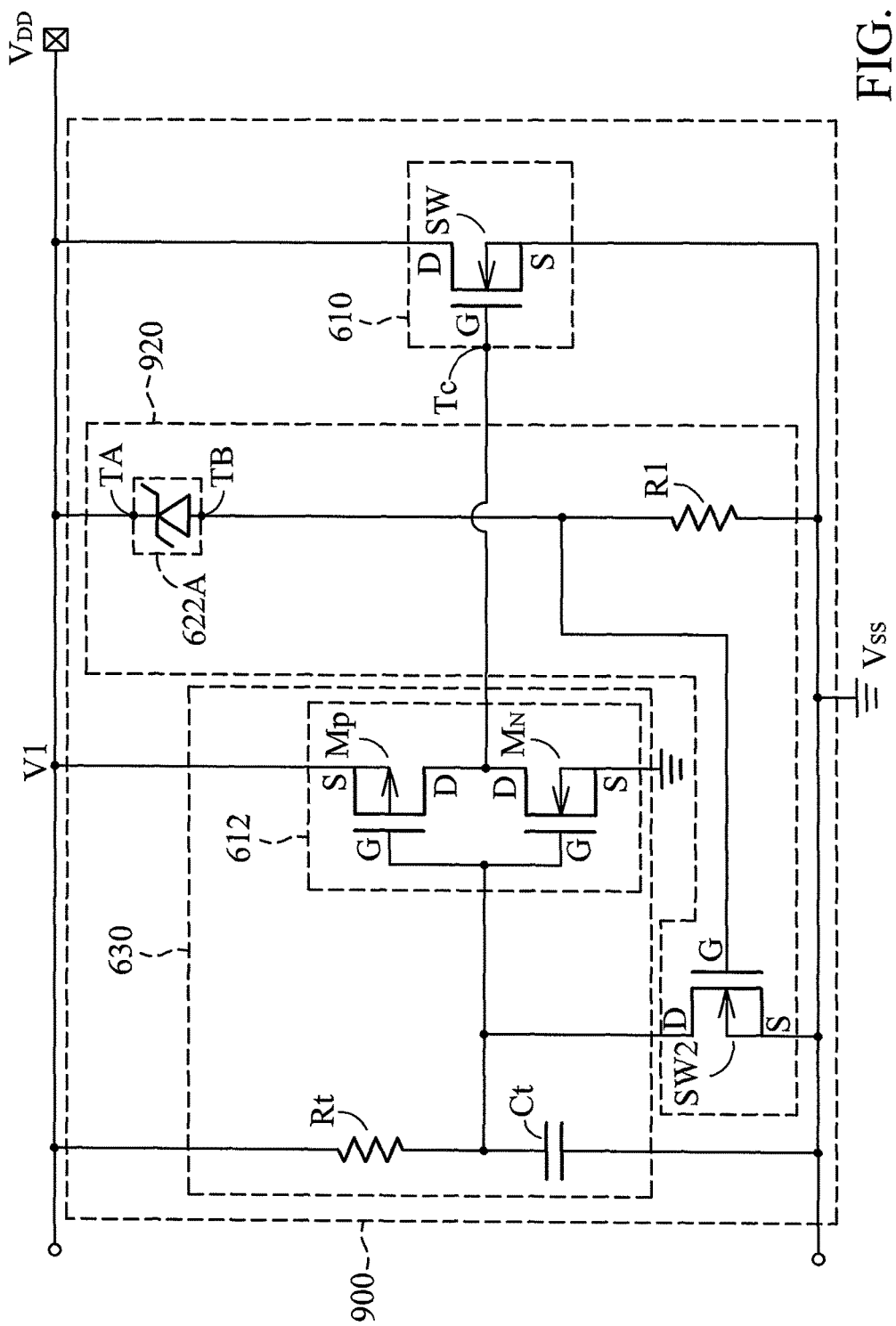
FIG. 6 is a schematic diagram illustrating a second embodiment of the electrostatic discharge protection circuit of FIG. 2 of the present invention.

FIG. 6 is a schematic diagram illustrating a second embodiment of the electrostatic discharge protection circuit of FIG. 2 of the present invention. As shown in FIG. 6, the electrostatic discharge protection circuit 900 is similar to the electrostatic discharge protection circuit 600 except that the voltage detection circuit 620 of the electrostatic discharge protection circuit 600 is replaced by the voltage detection circuit 920 of the electrostatic discharge protection circuit 900. The voltage detection circuit 920 is arranged to set the voltage at the control end Tc when the voltage V1 at the first rail VDD is greater than the limiting voltage, thereby driving the main ESD circuit 610 to establish the electrical connection between the first rail VDD and the second rail VSS. The voltage detection circuit 920 includes a resistor R1, a limiting voltage setup circuit 622A and a switch SW2. The first terminal TA of the limiting voltage setup circuit 622A is coupled to the first rail VDD, and the second terminal TB of the limiting voltage setup circuit 622A is coupled to the first terminal of the resistor R1. The second terminal of the resistor R1 is coupled to the second rail VSS. The first terminal D of the switch SW2 is coupled to the input terminal of the inverter 612, the second terminal S of the switch SW2 is coupled to the second rail VSS, and the control terminal G of the switch SW2 is coupled to the second terminal TB of the limiting voltage setup circuit 622A and the first terminal of the resistor R1. In this embodiment, the limiting voltage is the breakdown voltage of the zener diode of the limiting voltage setup circuit 622A. The limiting voltage setup circuit 622A is turned on when the voltage V1 of the first rail VDD is greater than the limiting voltage, such that the electrical connection between the first terminal TA and the second terminal TB is established. At the same time, the switch SW2 is turned on due to the high-level voltage applied to its control terminal G, and a low-level voltage is applied to the input terminal of the inverter 612 and a high-level voltage is applied to the control end Tc so as to turn on the switch SW. Therefore, the voltage detection circuit 920 drives the main ESD circuit 610 to turn on the switch SW when the voltage V1 at the first rail VDD is greater than the limiting voltage, and the electrical connection (discharge path) between the first rail VDD and the second rail VSS is established. In other embodiments, the limiting voltage setup circuit 622A of the voltage detection circuit 920 can be replaced by the limiting voltage setup circuit 622B of FIG. 4 or the limiting voltage setup circuit 622C of FIG. 5.

The actuation of the electrostatic driving circuit 630 of the electrostatic discharge protection circuit 900 during the occurrence of the ESD event is similar to the electrostatic driving circuit 630 of the electrostatic discharge protection circuit 600 of FIG. 3. The details of the actuation can be referred to in FIG. 3.

Figure 7:
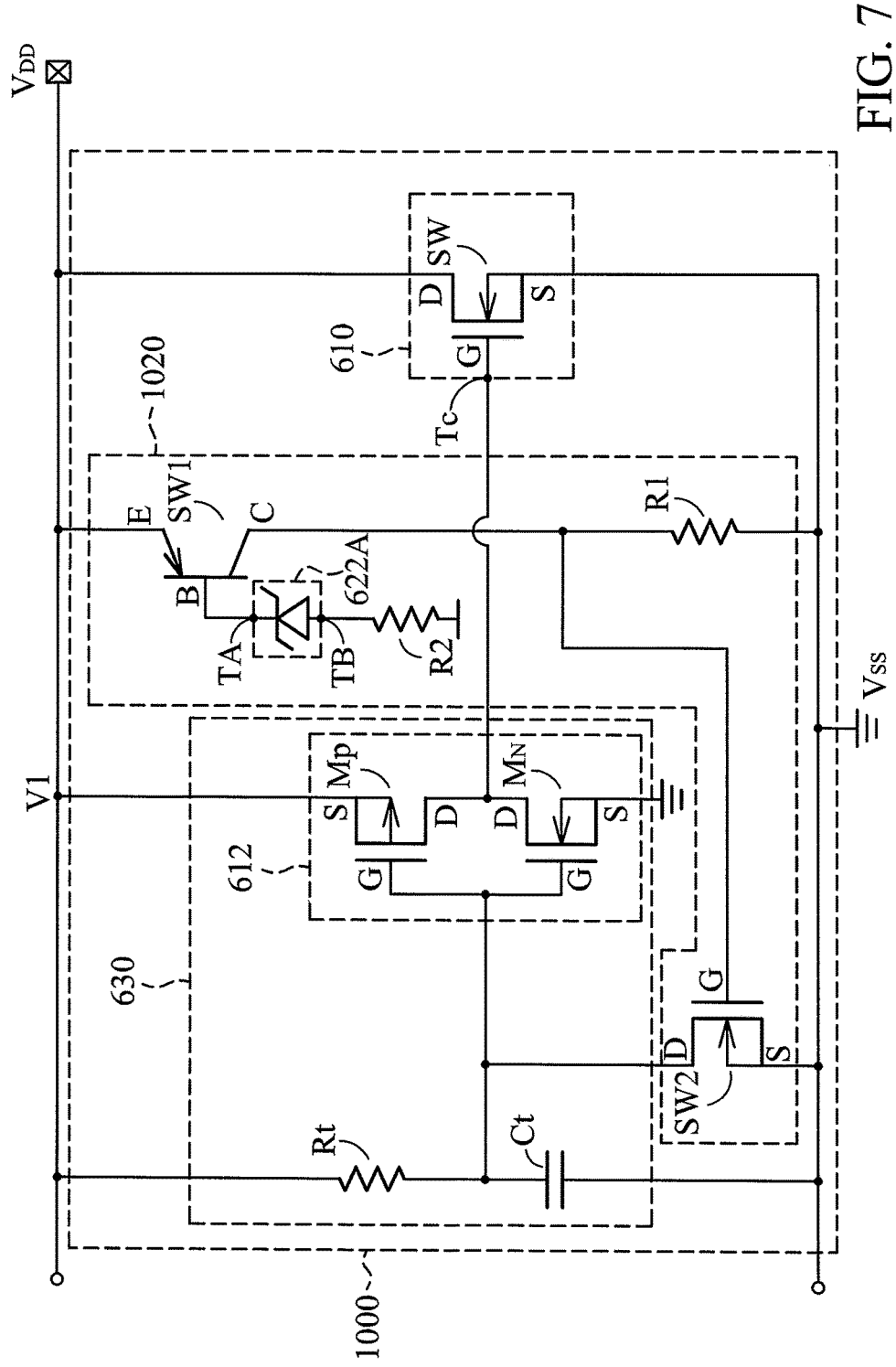
FIG. 7 is a schematic diagram illustrating a third embodiment of the electrostatic discharge protection circuit of FIG. 2 of the present invention.

FIG. 7 is a schematic diagram illustrating a third embodiment of the electrostatic discharge protection circuit of FIG. 2 of the present invention. As shown in FIG. 7, the electrostatic discharge protection circuit 1000 is similar to the electrostatic discharge protection circuit 600 except that the voltage detection circuit 620 of the electrostatic discharge protection circuit 600 is replaced by the voltage detection circuit 1020 of the electrostatic discharge protection circuit 1000. The voltage detection circuit 1020 includes a first switch SW1, a limiting voltage setup circuit 622A, a first resistor R1, a second resistor R2 and a second switch SW2. The first terminal E of the first switch SW1 is coupled to the first rail VDD, and the second terminal C of the first switch SW1 is coupled to the first terminal of the first resistor R1. The control terminal B of the first switch SW1 can be connected to the first terminal TA of the limiting voltage setup circuit 622A. The second terminal of the first resistor R1 is coupled to the second rail VSS. The first terminal D of the second switch SW2 is coupled to the input terminal of the inverter 612, the second terminal S of the second switch SW2 is coupled to the second rail VSS, and the control terminal G of the second switch SW2 is coupled to the second terminal C of the first switch SW1 and the first terminal of the first resistor R1. In this embodiment, the limiting voltage is the sum of the breakdown voltage of the zener diode, the turn-on voltage of the emitter-base interface of the first switch SW1, and the cross voltage of the second resistor R2. The first switch SW1 and the zener diode are turned on when the voltage V1 of the first rail VDD is greater than the limiting voltage, such that the electrical connection between the first terminal TA and the second terminal TB of the limiting voltage setup circuit 622A is established. At the same time, the second switch SW2 is turned on by the high voltage at its control terminal G. When the second switch SW2 is turned on, a low voltage is applied to the input terminal of the inverter 612, and a high voltage is applied to the control end Tc, such that the switch SW is turned on by the main ESD circuit 610 in response to the low voltage at the input terminal of the inverter 612 and the high voltage at the control end Tc. Therefore, when the voltage V1 at the first rail VDD is greater than the limiting voltage, the voltage detection circuit 1020 drives the main ESD circuit 610 to turn on the switch SW to establish the electrical connection (discharge path) between the first rail VDD and the second rail VSS. In other embodiments, the limiting voltage setup circuit 622A of the voltage detection circuit 1020 can be replaced by the limiting voltage setup circuit 622B of FIG. 4 or the limiting voltage setup circuit 622C of FIG. 5.

In this embodiment, the second resistor R2 can be coupled between the second terminal TB of the limiting voltage setup circuit 622A and the second rail VSS, or between the control terminal B of the first switch SW1 and the first terminal TA of the limiting voltage setup circuit 622A. Moreover, the voltage detection circuit 1020 may not include the second resistor R2. In this case, the limiting voltage is the sum of the breakdown voltage of the zener diode and the turn-on voltage of the emitter-base interface of the first switch SW1.

Furthermore, the actuation of the electrostatic driving circuit 630 of the electrostatic discharge protection circuit 1000 during the ESD event is similar to the actuation of the electrostatic driving circuit 630 of the electrostatic discharge protection circuit 600 of FIG. 3. The details of the actuation can be referred to in FIG. 3.

Figure 8:
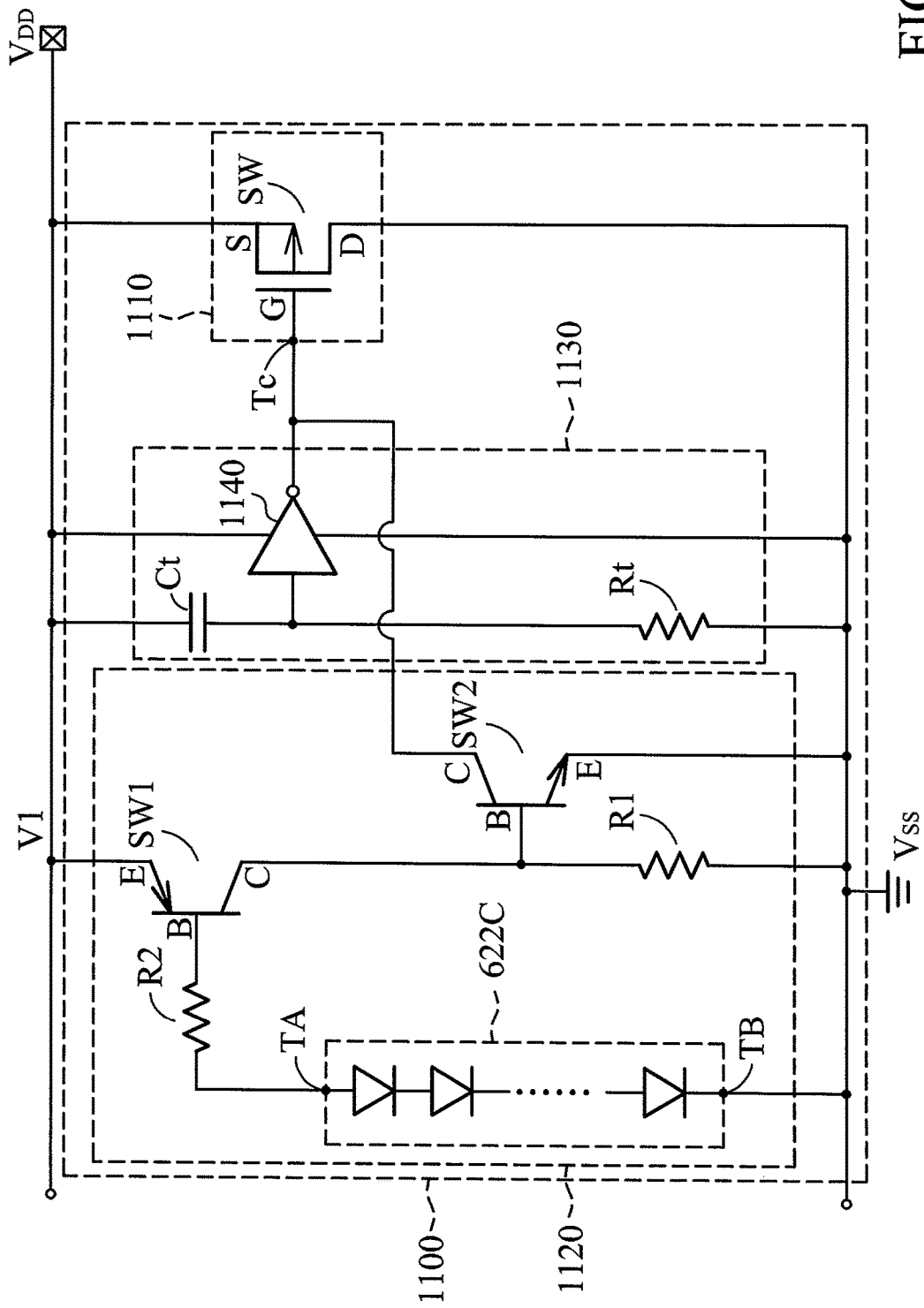
FIG. 8 is a schematic diagram illustrating a fourth embodiment of the electrostatic discharge protection circuit of FIG. 2 of the present invention.

FIG. 8 is a schematic diagram illustrating a fourth embodiment of the electrostatic discharge protection circuit of FIG. 2 of the present invention. As shown in FIG. 8, the electrostatic discharge protection circuit 1100 includes a main ESD circuit 1110, a voltage detection circuit 1120 and an electrostatic driving circuit 1130. The main ESD circuit 1110 is configured to establish the electrical connection between the first rail VDD and the second rail VSS based on the voltage at the control end Tc. The voltage detection circuit 1120 is configured to set the voltage at the control end Tc when the voltage V1 at the first rail VDD is greater than the limiting voltage, so as to drive the main ESD circuit 1110 to establish the electrical connection between the first rail VDD and the second rail VSS. The electrostatic driving circuit 1130 is configured to set the voltage at the control end Tc when the instant variation of the voltage V1 of the first rail is greater than the predetermined value, so as to drive the main ESD circuit 1110 to establish the electrical connection between the first rail VDD and the second rail VSS.

The voltage detection circuit 1120 includes a first switch SW1, a limiting voltage setup circuit 622C, a first resistor R1 and a second switch SW2. The first terminal E of the first switch SW1 is coupled to the first rail VDD, and the second terminal C of the first switch SW1 is coupled to the first terminal of the first resistor R1. The control terminal B of the first switch SW1 can be connected to the first terminal TA of the limiting voltage setup circuit 622C, or coupled to the first terminal TA of the limiting voltage setup circuit 622C through the second resistor R2. The second terminal of the first resistor R1, the second terminal TB of the limiting voltage setup circuit 622C and the second terminal E of the second switch SW2 are coupled to the second rail VSS. The first terminal C of the second switch SW2 is coupled to the control end Tc of the main ESD circuit 1110, and the control terminal B of the second switch SW2 is coupled to the second terminal C of the first switch SW1 and the first terminal of the first resistor R1.

In this embodiment, when the voltage detection circuit 1120 does not include the second resistor R2, the limiting voltage is the sum of the forward voltages of the diodes D1~DN and the turn-on voltage of the emitter-base interface of the first switch SW1. When the voltage V1 at the first rail VDD is greater than the limiting voltage, the first switch SW1 is turned on, and the electrical connection between the first terminal TA and the second terminal TB of the limiting voltage setup circuit 622C is established. At the same time, the second switch SW2 is turned on in response to the high voltage applied to the control terminal B, such that the main ESD circuit 1110 is turned on in response to the low voltage applied to the control end Tc, and the electrical connection between the first rail VDD and the second rail VSS is established. Therefore, when the voltage V1 at the first rail VDD is greater than the limiting voltage, the voltage detection circuit 1120 drives the main ESD circuit 1110 to turn on the switch SW for establishing the electrical connection between the first rail VDD and the second rail VSS. In this embodiment, the limiting voltage setup circuit 622C of the voltage detection circuit 1120 can be replaced by the limiting voltage setup circuit 622A of the FIG. 3 or the limiting voltage setup circuit 622B of FIG. 4.

In this embodiment, the voltage detection circuit 1120 may further include a second resistor R2. The second resistor R2 and the limiting voltage setup circuit 622C are coupled in series with each other between the control terminal B of the first switch SW1 and the second rail VSS, wherein the second resistor R2 can be coupled between the second terminal TB of the limiting voltage setup circuit 622C and the second rail VSS, or between the control terminal B of the first switch SW1 and the first terminal TA of the limiting voltage setup circuit 622C.

In this embodiment, the electrostatic driving circuit 1130 includes a capacitor Ct, a resistor Rt and an inverter 1140. The first terminal of the capacitor Ct is coupled to the first rail VDD, the second terminal of the capacitor Ct is coupled to the first terminal of the resistor Rt, and the second terminal of the resistor Rt is coupled to the second rail VSS. The input terminal of the inverter 1140 is coupled to the second terminal of the capacitor Ct and the first terminal of the resistor Rt, and the output terminal of the inverter 1140 is coupled to the control end Tc of the main ESD circuit 1110. The capacitor Ct and the resistor Rt are configured to provide the time constant, such that a high-level voltage is applied to the input terminal of the inverter 1140 when the variation of the voltage V1 at the first rail VDD as a result of the electrostatic discharge during the period of the time constant is greater than the predetermined value. Under this condition, a low-level voltage is applied to the control end Tc, and thus the switch SW of the main ESD circuit 1110 is turned on to establish the electrical connection between the first rail VDD and the second rail VSS, so as to form a discharge path when the low-level voltage is applied to the control end Tc. Therefore, the ESD current can be discharged through the electrical connection established by the main ESD circuit 1110 immediately.

Figure 9:
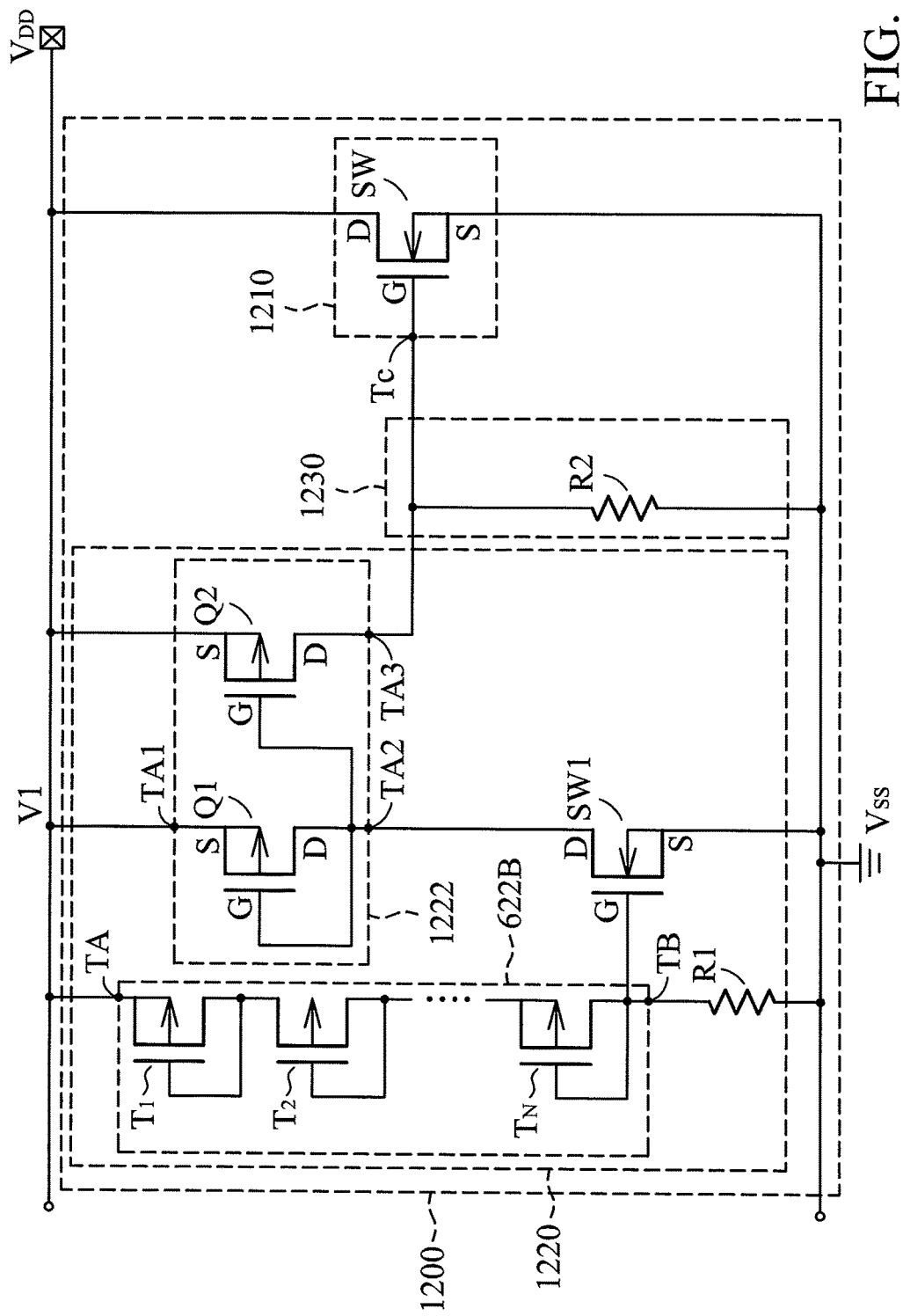
FIG. 9 is a schematic diagram illustrating a fifth embodiment of the electrostatic discharge protection circuit of FIG. 2 of the present invention.

FIG. 9 is a schematic diagram illustrating a fifth embodiment of the electrostatic discharge protection circuit of FIG. 2 of the present invention. As shown in FIG. 9, the electrostatic discharge protection circuit 1200 includes a main ESD circuit 1210, a voltage detection circuit 1220 and an electrostatic driving circuit 1230. The main ESD circuit 1210 is configured to establish the electrical connection between the first rail VDD and the second rail VSS based on the voltage at the control end Tc. The voltage detection circuit 1220 is configured to set the voltage at the control end Tc when the voltage V1 at the first rail VDD is greater than the limiting voltage, so as to drive the main ESD circuit 1210 to establish the electrical connection between the first rail VDD and the second rail VSS. The electrostatic driving circuit 1230 is configured to set the voltage V1 at the control end Tc when the instant variation of the voltage V1 of the first rail is greater than the predetermined value, so as to drive the main ESD circuit 1210 to establish the electrical connection between the first rail VDD and the second rail VSS.

The voltage detection circuit 1220 includes a limiting voltage setup circuit 622B, a first resistor R1, a current mirror circuit 1222 and a first switch SW1, and the electrostatic driving circuit 1230 includes a second resistor R2. The first terminal TA of the limiting voltage setup circuit 622B is coupled to the first rail VDD, the second terminal TB of the limiting voltage setup circuit 622B is coupled to the first terminal of the first resistor R1 and the control terminal G of the first switch SW1, and the second terminal of the first resistor R1 is coupled to the second rail VSS. The first terminal TA1 of the current mirror circuit 1222 is coupled to the first rail VDD, the second terminal TA2 of the current mirror circuit 1222 is coupled to the first terminal D of the first switch SW1, and the third terminal TA3 of the current mirror circuit 1222 is coupled to the control end Tc of the main ESD circuit 1210. The second terminal S of the first switch SW1 is coupled to the second rail VSS. The first terminal of the second resistor R2 is coupled to the control end Tc of the main ESD circuit 1210, and the second terminal of the second resistor R2 is coupled to the second rail VSS.

In this embodiment, the limiting voltage is the sum of the threshold voltages of the transistors T1~TN. When the voltage V1 of the first rail VDD is greater than the limiting voltage, the limiting voltage setup circuit 622B establishes the electrical connection between the first terminal TA and the second terminal TB, such that a high-level voltage is applied to the first terminal of the first resistor R1 to turn on the first switch SW1. When the first switch SW1 is turned on, the transistor Q1 and the transistor Q2 of the current mirror circuit 1222 are turned on, and the switch SW of the main ESD circuit 1210 is turned on by the high-level voltage applied to the control end Tc. Therefore, when the voltage V1 of the first rail VDD is greater than the limiting voltage, the voltage detection circuit 1220 drives the main ESD circuit 1210 to turn on the switch SW to establish the electrical connection between the first rail VDD and the second rail VSS, thereby forming the discharge path. In other embodiments, the limiting voltage setup circuit 622B of the voltage detection circuit 1220 can be replaced by the limiting voltage setup circuit 622A of the FIG. 3 or the limiting voltage setup circuit 622C of FIG. 5.

Figure 10:
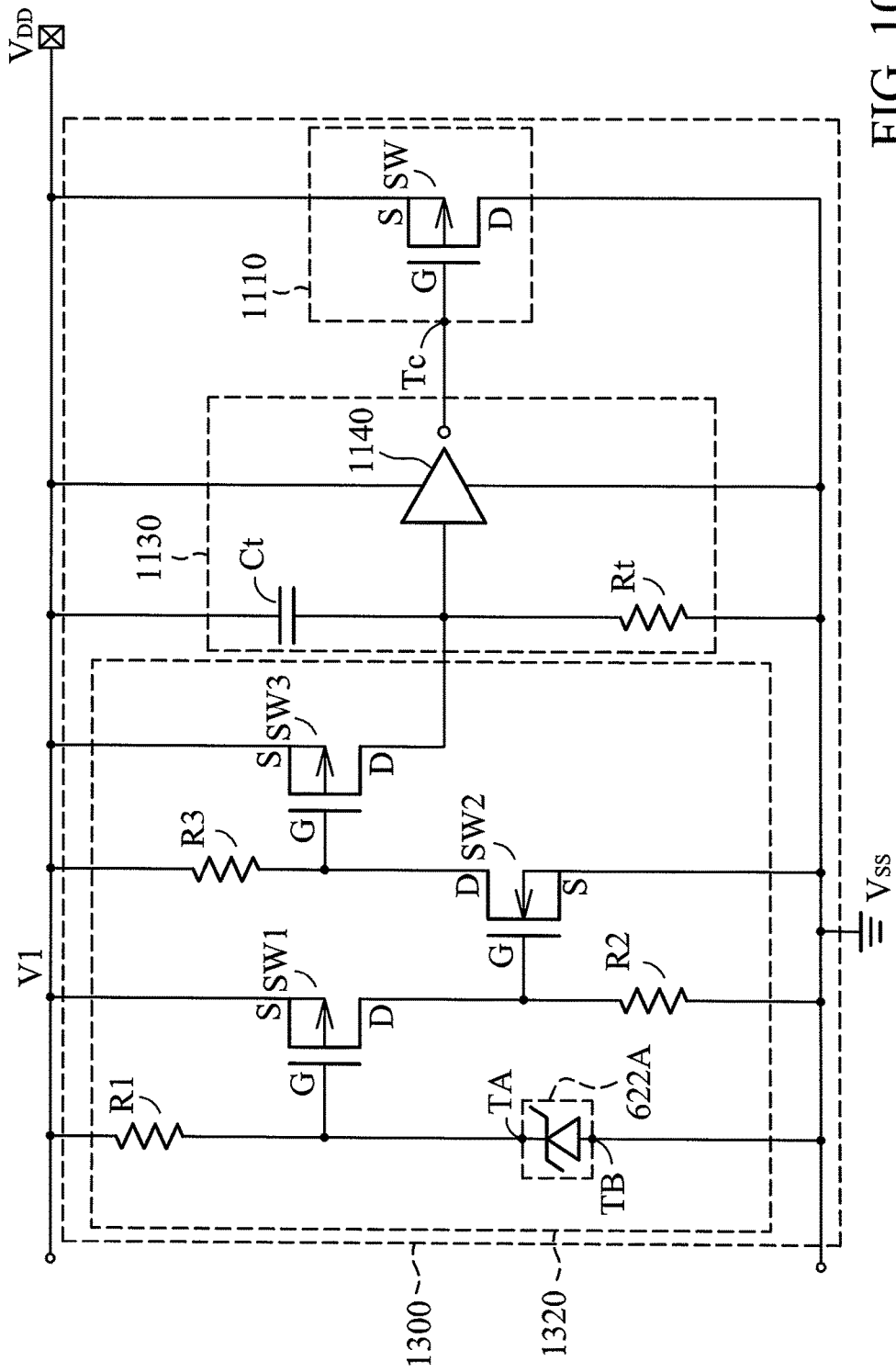
FIG. 10 is a schematic diagram illustrating a sixth embodiment of the electrostatic discharge protection circuit of FIG. 2 of the present invention.

FIG. 10 is a schematic diagram illustrating a sixth embodiment of the electrostatic discharge protection circuit of FIG. 2 of the present invention. As FIG. 10 shows, the electrostatic discharge protection circuit 1300 is similar to the electrostatic discharge protection circuit 1100 except that the voltage detection circuit 1120 of the electrostatic discharge protection circuit 1110 is replaced by the voltage detection circuit 1320 of the electrostatic discharge protection circuit 1300. The voltage detection circuit 1320 is configured to set the voltage at the control end Tc when the voltage V1 at the first rail VDD is greater than the limiting voltage, so as to drive the main ESD circuit 1110 to establish the electrical connection between the first rail VDD and the second rail VSS.

In this embodiment, the voltage detection circuit 1320 includes a first resistor R1, a limiting voltage setup circuit 622A, a first switch SW1, a second resistor R2, a third resistor R3, a second switch SW2 and a third switch SW3. The first terminal of the first resistor R1, the first terminal S of the first switch SW1, the first terminal of the third resistor R3 and the first terminal S of the third switch SW3 are coupled to the first rail VDD. The second terminal TB of the limiting voltage setup circuit 622A, the second terminal of the second resistor R2 and the second terminal S of the second switch SW2 are coupled to the second rail VSS. The second terminal of the first resistor R1 is coupled to the first terminal TA of the limiting voltage setup circuit 622A and the control terminal G of the first switch SW1. The second terminal D of the first switch SW1 is coupled to the first terminal of the second resistor R2 and the control terminal G of the second switch SW2. The second terminal of the third resistor R3 is coupled to the first terminal D of the second switch SW2 and the control terminal G of the third switch SW3. The second terminal D of the third switch SW3 is coupled to the input terminal of the inverter 1140.

In this embodiment, the limiting voltage is the breakdown voltage of the zener diode. When the voltage V1 at the first rail VDD is greater than the limiting voltage, the limiting voltage setup circuit 622A establishes the electrical connection between the first terminal TA and the second terminal TB, such that the low-level voltage is applied to the second terminal of the first resistor R1, and the first switch SW1 is turned on accordingly. When the first switch SW1 is turned on, the second switch SW2 is turned on by the high-level voltage at its control terminal G. When the second switch SW2 is turned on, the third switch SW3 is turned on by the low-level voltage at its control terminal G, and a high-level voltage is applied to the input terminal of the inverter 1140. At the same time, a low-level voltage is applied to the control end Tc, such that the switch SW is turned on to establish the electrical connection between the first rail VDD and the second rail VSS. Therefore, the voltage detection circuit 1320 drives the main ESD circuit 1110 to establish the electrical connection between the first rail VDD and the second rail VSS when the voltage V1 at the first rail VDD is greater than the limiting voltage.

Moreover, the actuation of the electrostatic driving circuit 1130 of the electrostatic discharge protection circuit 1300 during the electrostatic discharge event is similar to the actuation of the electrostatic driving circuit 1130 of the electrostatic discharge protection circuit 1100 of FIG. 8. The details can be referred to in FIG. 8.

Figure 11:
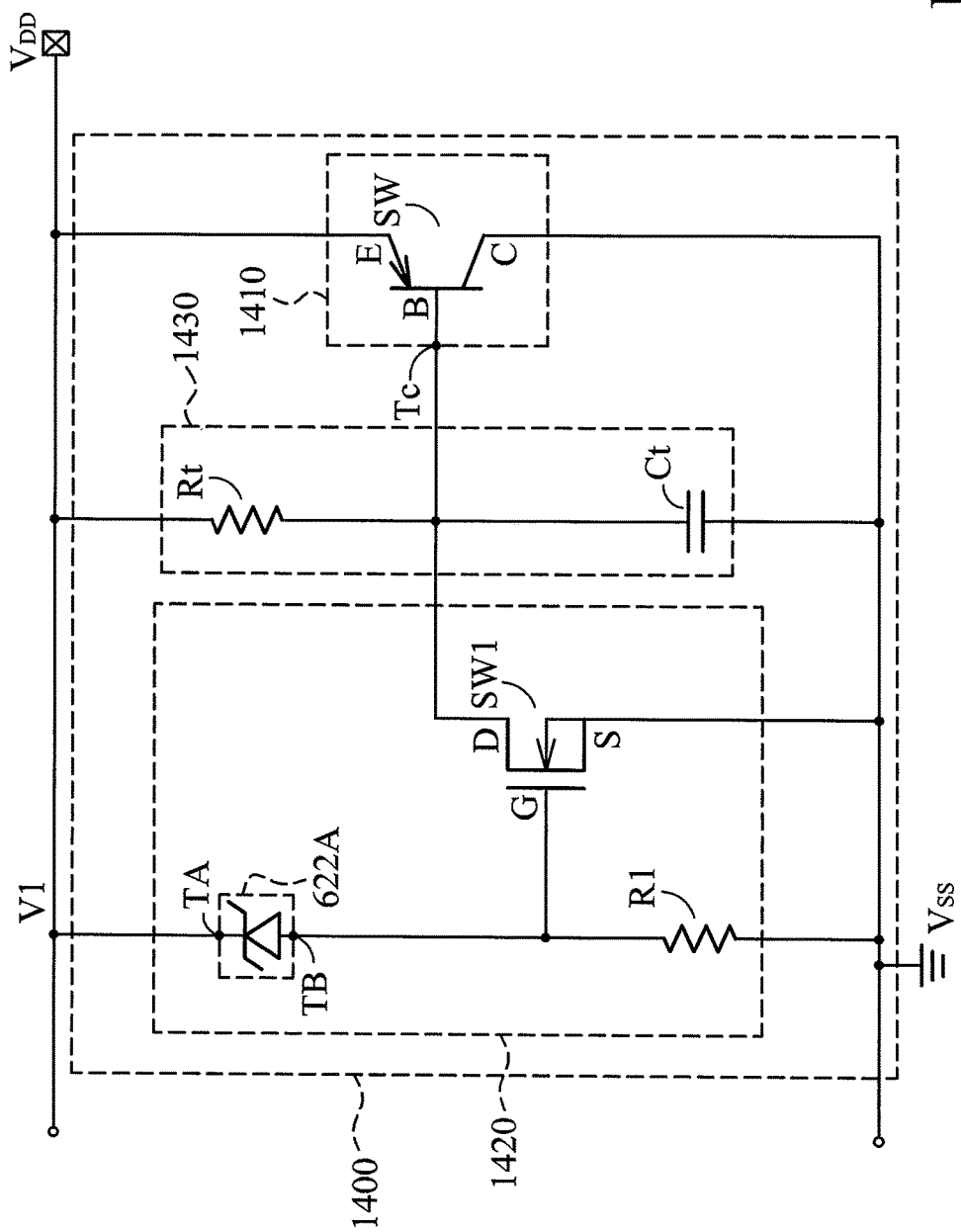
FIG. 11 is a schematic diagram illustrating a seventh embodiment of the electrostatic discharge protection circuit of FIG. 2 of the present invention.

FIG. 11 is a schematic diagram illustrating a seventh embodiment of the electrostatic discharge protection circuit of FIG. 2 of the present invention. As shown in FIG. 11, the electrostatic discharge protection circuit 1400 includes a main ESD circuit 1410, a voltage detection circuit 1420 and an electrostatic driving circuit 1430. The main ESD circuit 1410 is configured to establish the electrical connection between the first rail VDD and the second rail VSS based on the voltage at the control end Tc. The voltage detection circuit 1420 is configured to set the voltage at the control end Tc when the voltage V1 at the first rail VDD is greater than the limiting voltage, so as to drive the main ESD circuit 1410 to establish the electrical connection between the first rail VDD and the second rail VSS. The electrostatic driving circuit 1430 is configured to set the voltage at the control end Tc when the instant variation of the voltage V1 at the first rail VDD is greater than the predetermined value, so as to drive the main ESD circuit 1410 to establish the electrical connection between the first rail VDD and the second rail VSS.

In this embodiment, the main ESD circuit 1410 includes a switch SW, and the voltage detection circuit 1420 includes a limiting voltage setup circuit 622A, a first resistor R1 and a first switch SW1. The first terminal E of the switch SW is coupled to the first rail VDD, the second terminal C of the switch SW is coupled to the second rail VSS, and the control terminal B of the switch SW is coupled to the control end Tc of the main ESD circuit 1410. The first terminal TA of the limiting voltage setup circuit 622A is coupled to the first rail VDD, the second terminal TB of the limiting voltage setup circuit 622A is coupled to the first terminal of the first resistor R1 and the control terminal G of the first switch SW1. The second terminal of the first resistor R1 and the second terminal S of the first switch SW1 are coupled to the second rail VSS. The first terminal D of the first switch SW1 is coupled to the control end Tc of the main ESD circuit 1410.

In this embodiment, the limiting voltage is the breakdown voltage of the zener diode. When the voltage V1 of the first rail VDD is greater than the limiting voltage, the limiting voltage setup circuit 622A is turned on, and the first switch SW1 is turned on by the high-level voltage at the control terminal G. When the first switch SW1 is turned on, a low-level voltage is applied to the control end Tc, such that the switch SW of the main ESD circuit 1410 is turned on, and the electrical connection between the first rail VDD and the second rail VSS is established.

The electrostatic driving circuit 1430 includes a resistor Rt and a capacitor Ct. The resistor Rt and the capacitor Ct are arranged to provide the time constant. The first terminal of the resistor Rt is coupled to the first rail VDD, the second terminal of the resistor Rt and the first terminal of the capacitor Ct are coupled to the control end Tc of the main ESD circuit 1410, and the second terminal of the capacitor Ct is coupled to the second rail VSS. When an ESD event occurs, the electrostatic driving circuit 1430 enables a low-level voltage to be applied to the control end Tc to turn on the switch SW of the main ESD circuit 1410 and establish the electrical connection between the first rail VDD and the second rail VSS, thereby forming a discharge path.

The NMOS transistor(s) of the above embodiments can be replaced by the NPN bipolar junction transistor(s), and the PMOS transistor(s) of the above embodiments can be replaced by the PNP bipolar junction transistor(s). Similarly, the PMOS transistor(s) of the above embodiments can be replaced by the PNP bipolar junction transistor(s), and the NPN bipolar junction transistor(s) of the above embodiments can be replaced by the NMOS transistor(s).

In summary, by employing the electrostatic driving circuit of the electrostatic discharge protection circuit of the embodiments, the main ESD circuit can form a discharge path and provide ESD protection to prevent the ESD damage of the internal circuit when the ESD events occur. Moreover, when the voltage at the first rail is greater than the limiting voltage, the voltage detection circuit of the electrostatic discharge protection circuit depicted in the foregoing embodiments drives the main ESD circuit to form the discharge path to reduce the voltage level at the first rail in a short time. Therefore, when the voltage at the first rail is greater than the limiting voltage and the electrostatic driving circuit does not actuate due to the voltage boost rate being slower than the ESD discharge rate during the period of the time constant, the excessively high voltage at the first rail may enable the voltage detection circuit to actuate and drive the main ESD circuit to form the discharge path to prevent the internal circuit from breakdown as a result of the excessively high voltage and the latch-up phenomenon in the internal circuit.

While the invention has been described by way of example and in terms of the preferred embodiments, it is to be understood that the invention is not limited to the disclosed embodiments. On the contrary, it is intended to cover various modifications and similar arrangements, as would be apparent to those skilled in the art. Therefore, the scope of the appended claims should be accorded the broadest interpretation so as to encompass all such modifications and similar arrangements.

What is claimed is:

1. An electrostatic discharge protection circuit, comprising:
    a main electrostatic discharge (ESD) circuit, coupled between a first rail and a second rail, and having a control end, wherein the main ESD circuit is arranged to establish an electrical connection between the first rail and the second rail based on a voltage of the control end;
    a voltage detection circuit, coupled between the first rail and the second rail for setting the voltage at the control end when a voltage of the first rail is greater than a limiting voltage, thereby driving the main ESD circuit to establish the electrical connection between the first rail and the second rail; and
    an electrostatic driving circuit, coupled between the main ESD circuit and the control end for setting the voltage at the control end when an instant variation of the voltage at the first rail is greater than a predetermined value, thereby driving the main ESD circuit to establish the electrical connection between the first rail and the second rail,
    wherein the main ESD circuit, the voltage detection circuit and the electrostatic driving circuit are connected in parallel connection between the first rail and the second rail, and
    wherein the voltage detection circuit comprises:
        a limiting voltage setup circuit, having a first terminal and a second terminal, wherein the first terminal of the limiting voltage setup circuit is coupled to the first rail, and the limiting voltage setup circuit is arranged to establish an electrical connection between the first terminal of the limiting voltage setup circuit and the second terminal of the limiting voltage setup circuit when voltage at the first rail is greater than the limiting voltage;
        a first resistor, having a first terminal and a second terminal, wherein the first terminal of the first resistor is coupled to the second terminal of the limiting voltage setup circuit, and the second terminal of the first resistor is coupled to the second rail; and
        a first switch, having a first terminal, a second terminal and a control terminal, wherein the first terminal of the first switch is coupled to the control end of the main ESD circuit, the second terminal of the first switch is coupled to the second rail, and the control terminal of the first switch is coupled to the second terminal of the limiting voltage setup circuit and the first terminal of the first resistor.

2. The electrostatic discharge protection circuit as claimed in claim 1,
    wherein the first terminal of the first switch is coupled to the electrostatic driving circuit.

3. The electrostatic discharge protection circuit as claimed in claim 2, wherein the voltage detection circuit further comprises:
    a second switch, having a first terminal, a second terminal and a control terminal, wherein the first terminal of the second switch is coupled to the second terminal of the limiting voltage setup circuit, and the second terminal of the second switch is coupled to the first terminal of the first resistor and the control terminal of the first switch; and
    a second resistor, having a first terminal and a second terminal, wherein the first terminal of the second resistor is coupled to the control terminal of the second switch, and the second terminal of the second resistor is coupled to the second rail.

4. An electrostatic discharge protection circuit, comprising:
    a main electrostatic discharge (ESD) circuit, coupled between a first rail and a second rail, and having a control end, wherein the main ESD circuit is arranged to establish an electrical connection between the first rail and the second rail based on a voltage of the control end, a voltage detection circuit, coupled between the first rail and the second rail for setting the voltage at the control end when a voltage of the first rail is greater than a limiting voltage, thereby driving the main ESD circuit to establish the electrical connection between the first rail and the second rail; and an electrostatic driving circuit, coupled between the main ESD circuit and the control end for setting the voltage at the control end when an instant variation of the voltage at the first rail is greater than a predetermined value, thereby driving the main ESD circuit to establish the electrical connection between the first rail and the second rail, wherein the main ESD circuit, the voltage detection circuit and the electrostatic driving circuit are connected in parallel connection between the first rail and the second rail, and wherein the voltage detection circuit comprises:
   a first switch, having a first terminal, a second terminal and a control terminal, wherein the first terminal of the first switch is coupled to the first rail;
   a limiting voltage setup circuit, having a first terminal and a second terminal, wherein the limiting voltage setup circuit is coupled between the control terminal of the first switch and the second rail, the limiting voltage setup circuit is arranged to establish an electrical connection between the first terminal of the limiting voltage setup circuit and the second terminal of the limiting voltage setup circuit when voltage at the first rail is greater than the limiting voltage;
   a first resistor, having a first terminal and a second terminal, wherein the first terminal of the first resistor is coupled to the second terminal of the first switch, and the second terminal of the first resistor is coupled to the second rail; and
   a second switch, having a first terminal, a second terminal and a control terminal, wherein the first terminal of the second switch is coupled to the control end of the main ESD circuit, the control terminal of the second switch is coupled to the second terminal of the first switch and the first terminal of the first resistor, and the second terminal of the second switch is coupled to the second rail.

5. The electrostatic discharge protection circuit as claimed in claim 4, wherein the voltage detection circuit further comprises:
   a second resistor, coupled to the limiting voltage setup circuit in series between the control terminal of the first switch and the second rail.

6. An electrostatic discharge protection circuit, comprising:
   a main electrostatic discharge (ESD) circuit, coupled between a first rail and a second rail, and having a control end, wherein the main ESD circuit is arranged to establish an electrical connection between the first rail and the second rail based on a voltage of the control end;
   a voltage detection circuit, coupled between the first rail and the second rail for setting the voltage at the control end when a voltage of the first rail is greater than a limiting voltage, thereby driving the main ESD circuit to establish the electrical connection between the first rail and the second rail; and
   an electrostatic driving circuit, coupled between the main ESD circuit and the control end for setting the voltage at the control end when an instant variation of the voltage at the first rail is greater than a predetermined value, thereby driving the main ESD circuit to establish the electrical connection between the first rail and the second rail, wherein the main ESD circuit, the voltage detection circuit and the electrostatic driving circuit are connected in parallel connection between the first rail and the second rail, and wherein the voltage detection circuit comprises:
   a first resistor, having a first terminal and a second terminal, wherein the first terminal of the first resistor is coupled to the first rail;
   a limiting voltage setup circuit, having a first terminal and a second terminal, wherein the first terminal of the limiting voltage setup circuit is coupled to the second terminal of the first resistor, and the second terminal of the limiting voltage setup circuit is coupled to the second rail, and wherein the limiting voltage setup circuit is arranged to establish an electrical connection between the first terminal of the limiting voltage setup circuit and the second terminal of the limiting voltage setup circuit when voltage at the first rail is greater than the limiting voltage;
   a first switch, having a first terminal, a second terminal and a control terminal, wherein the first terminal of the first switch is coupled to the first rail, the control terminal of the first switch is coupled to the second terminal of the first resistor and the first terminal of the limiting voltage setup circuit;
   a second resistor, having a first terminal and a second terminal, wherein the first terminal of the second resistor is coupled to the second terminal of the first switch, and the second terminal of the second resistor is coupled to the second rail;
   a third resistor, having a first terminal and a second terminal, wherein the first terminal of the third resistor is coupled to the first rail;
   a second switch, having a first terminal, a second terminal and a control terminal, wherein the first terminal of the second switch is coupled to the second terminal of the third resistor, the second terminal of the second switch is coupled to the second rail, and the control terminal of the second switch is coupled to the second terminal of the first switch and the first terminal of the second resistor; and
   a third switch, having a first terminal, a second terminal and a control terminal, wherein the first terminal of the third switch is coupled to the first rail, the second terminal of the third switch is coupled to the electrostatic driving circuit, and the control terminal of the third switch is coupled to the first terminal of the second switch and the second terminal of the third resistor.

7. The electrostatic discharge protection circuit as claimed in claim 6, wherein the electrostatic driving circuit comprises a resistor, a capacitor and an inverter, and wherein the resistor of the electrostatic driving circuit and the capacitor of the electrostatic driving circuit are coupled in series with each other between the first rail and the second rail, the resistor of the electrostatic driving circuit and the capacitor of the electrostatic driving circuit are coupled to an input terminal of the inverter, and an output terminal of the inverter is coupled to the control end of the main ESD circuit.

8. The electrostatic discharge protection circuit as claimed in claim 1, wherein the electrostatic driving circuit comprises a resistor and a capacitor, and wherein a first terminal of the resistor of the electrostatic driving circuit is coupled to the first rail, a second terminal of the resistor of the electrostatic driving circuit and a first terminal of the capacitor of the electrostatic driving circuit are coupled with each other to the control end of the main ESD circuit, and a second terminal of the capacitor of the electrostatic driving circuit is coupled to the second rail.

9. The electrostatic discharge protection circuit as claimed in claim 1, wherein the voltage detection circuit further comprises:
   a current mirror circuit, having a first terminal, a second terminal and a third terminal, wherein the first terminal of the current mirror circuit is coupled to the first rail, and the third terminal of the current mirror circuit is coupled to the control end of the main ESD circuit, and the second terminal of the current mirror circuit is coupled to the first terminal of the first switch.

10. The electrostatic discharge protection circuit as claimed in claim 9, wherein the electrostatic driving circuit comprises a second resistor, having a first terminal coupled to the control end of the main ESD circuit, and a second terminal coupled to the second rail.

11. The electrostatic discharge protection circuit as claimed in claim 9, wherein the main ESD circuit comprises a fourth switch, having a first terminal coupled to the first rail, a second terminal coupled to the second rail, and a control terminal coupled to the control end of the main ESD circuit.

12. The electrostatic discharge protection circuit as claimed in claim 9, wherein the limiting voltage setup circuit includes a zener diode, a plurality of serially-connected diodes, or a plurality of serially-connected transistors.

13. The electrostatic discharge protection circuit as claimed in claim 4, wherein the first terminal of the second switch is coupled to the electrostatic driving circuit.

* * * * *